United States Patent
Shen et al.

(10) Patent No.: US 8,105,877 B2
(45) Date of Patent: Jan. 31, 2012

(54) METHOD OF FABRICATING A STACKED TYPE CHIP PACKAGE STRUCTURE

(75) Inventors: Chi-Chih Shen, Kaohsiung (TW); Jen-Chuan Chen, Taoyuan County (TW); Hui-Shan Chang, Taoyuan County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 603 days.

(21) Appl. No.: 12/192,365

(22) Filed: Aug. 15, 2008

(65) Prior Publication Data

US 2009/0091041 A1 Apr. 9, 2009

(30) Foreign Application Priority Data

Oct. 5, 2007 (TW) ............................... 96137454 A (51) Int. Cl.
*H01L 21/00* (2006.01)
(52) U.S. Cl. ........................ 438/113; 438/127; 257/686
(58) Field of Classification Search .................. 438/113, 438/127; 257/686
See application file for complete search history.

(56) References Cited

U.S. PATENT DOCUMENTS

| 6,476,503 | B1 * | 11/2002 | Imamura et al. | 257/780 |
| 6,583,512 | B2 * | 6/2003 | Nakaoka et al. | 257/777 |
| 6,734,552 | B2 * | 5/2004 | Combs et al. | 257/707 |
| 7,087,538 | B2 * | 8/2006 | Staines et al. | 438/782 |
| 2002/0004288 | A1 * | 1/2002 | Nishiyama | 438/464 |
| 2004/0145051 | A1 * | 7/2004 | Klein et al. | 257/734 |
| 2005/0167798 | A1 * | 8/2005 | Doan | 257/678 |
| 2009/0008794 | A1 * | 1/2009 | Wu et al. | 257/777 |

* cited by examiner

*Primary Examiner* — Steven Loke
*Assistant Examiner* — Kimberly M Thomas
(74) *Attorney, Agent, or Firm* — J.C. Patents (57) ABSTRACT

A stacked type chip package structure including a package structure, a corresponding substrate, and a number of second bumps is provided. The package structure includes a first chip, a second chip, a number of first bumps, and a first underfill. The first chip is disposed above the second chip. The first bumps are disposed between the first chip and the second chip for electrically connecting the first chip and the second chip. The first underfill is used to fill between the first chip and the second chip and encapsulates the first bumps. The package structure is disposed above the corresponding substrate in a reverse manner, such that the first chip is disposed between the second chip and the corresponding substrate. The second bumps are disposed between the second chip and the corresponding substrate, such that the second chip is electrically connected to the corresponding substrate through the second bumps.

14 Claims, 10 Drawing Sheets

METHOD OF FABRICATING A STACKED TYPE CHIP PACKAGE STRUCTURE

CROSS-REFERENCE TO RELATED APPLICATION

This application claims the priority benefit of Taiwan application serial no. 96137454, filed Oct. 5, 2007. The entirety of the above-mentioned patent application is hereby incorporated by reference herein and made a part of this specification.

BACKGROUND OF THE INVENTION

1. Field of the Invention

The present invention relates to a stacked type chip package structure and a method of fabricating the same. More particularly, the present invention relates to a stacked type chip package structure on which a thinning process is performed and a method of fabricating the stacked type chip package structure.

2. Description of Related Art

Currently, electronic devices commensurate with market demands and advancement of manufacturing technologies are progressing. In consideration of the portability of and growing demands for computer, communication and consumer (3C) electronic products, a conventional single chip package structure gradually fails to comply with the requirements in the market. Namely, trends of lightness, thinness, shortness, smallness, compactness, high density, and low costs must be taken into account in designing the products. As such, in view of the requirements for lightness, thinness, shortness, smallness, and compactness, integrated circuits (IC) with various functions are stacked in different manners for reducing dimensions and thickness of package products, which has become a mainstream strategy in the package market. At present, the package products having a package on package (POP) structure or a package in package (PIP) structure are researched and developed in response to such trend.

Figure 1:
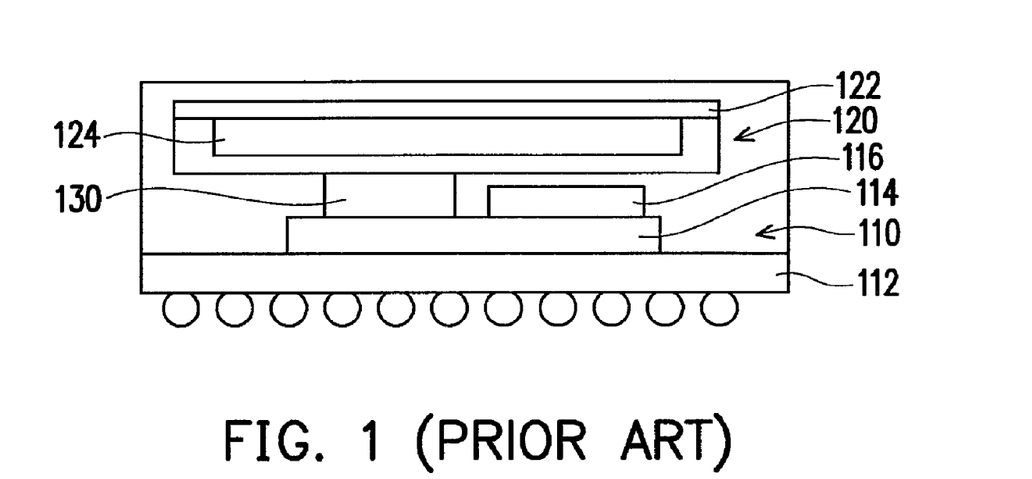
FIG. 1 is a schematic cross-sectional view of a conventional PIP structure.

FIG. 1 is a schematic cross-sectional view of a conventional PIP structure. As indicated in FIG. 1, an individual package 120 in which no solder balls are installed is stacked on a chip 114 of another package 110 in the PIP structure, and a spacer 130 is disposed between the package 120 and the chip 114. After that, a molding process is performed on both the packages 120 and 110. The package 110 has a substrate 112, the chip 114, and a chip 116. The chips 114 and 116 are stacked on the substrate 112 in sequence. By contrast, the package 120 has a substrate 122 and a chip 124 stacked on the substrate 122.

Figure 2:
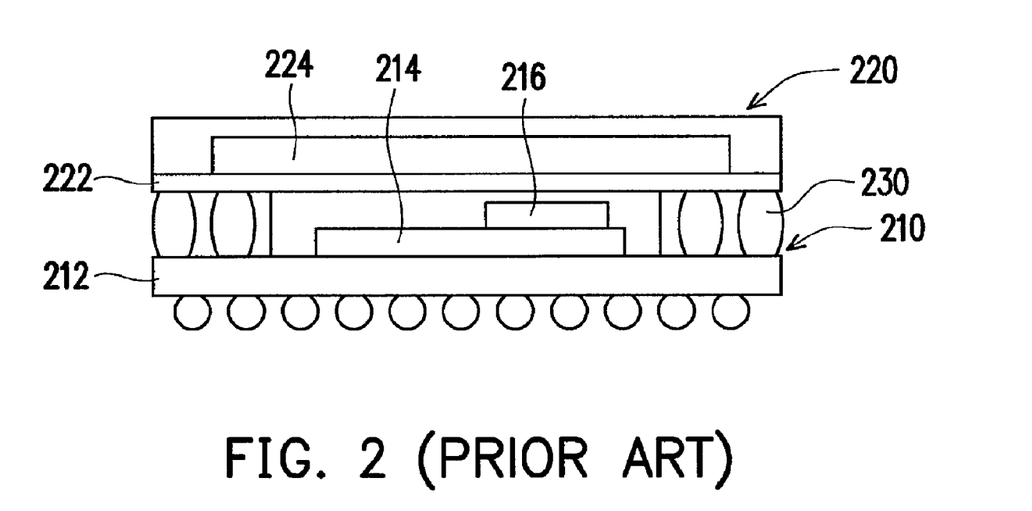
FIG. 2 is a schematic cross-sectional view of a conventional POP structure.

FIG. 2 is a schematic cross-sectional view of a conventional POP structure. As shown in FIG. 2, in the POP structure, two individual packages 210 and 220 are packaged and inspected first, and then the two packages 210 and 220 are adhered and electrically connected to each other through solder balls 230. Thereby, the POP structure is formed. The package 210 has a substrate 212 and chips 214 and 216 stacked on the substrate 212. By contrast, the package 220 has a substrate 222 and a chip 224 stacked on the substrate 222.

With the increasing complexity and the enhancement of the functions of the electronic devices, the required number of the chips that are stacked in the POP structure and the PIP structure is increased day by day. As such, it is imperative to control the thickness of the chips, so as to reduce space occupied by the stacked chips and further reduce the thickness of the chip package structure in a package process.

SUMMARY OF THE INVENTION

The present invention is directed to a stacked type chip package structure in which chips are of a relatively thin thickness, so as to effectively reduce the entire thickness of the stacked type chip package structure.

The present invention is further directed to a method of fabricating a stacked type chip package structure. In the method, a plurality of first chips are respectively disposed on a second wafer, and back surfaces of the first chips are polished. The thickness of the chips can be reduced by repetitively performing the aforesaid steps, and the thickness of the stacked type chip package structure can then be reduced.

In view of the above, the present invention provides a stacked type chip package structure mainly including a package structure, a corresponding substrate, and a plurality of second bumps. The package structure includes a first chip, a second chip, a plurality of first bumps, and a first underfill. The first chip is disposed above the second chip. The first bumps are disposed between the first chip and the second chip, such that the first chip and the second chip are electrically connected through the first bumps. The first underfill fills between the first chip and the second chip and encapsulates the first bumps. The package structure is disposed above the corresponding substrate in a reverse manner, such that the first chip is disposed between the second chip and the corresponding substrate. The second bumps are disposed between the second chip and the corresponding substrate, such that the second chip is electrically connected to the corresponding substrate through the second bumps.

In an embodiment of the present invention, the first bumps are gold bumps or gold stud bumps.

In an embodiment of the present invention, the second bumps are gold bumps or gold stud bumps.

In an embodiment of the present invention, each of the second bumps is formed by stacking two bump units.

In an embodiment of the present invention, the corresponding substrate is a wafer or a printed circuit board.

In an embodiment of the present invention, the stacked type chip package structure further includes a second underfill filling between the second chip and the corresponding substrate and encapsulating the second bumps, the first chip, and the first underfill.

The present invention further provides a method of fabricating a stacked type chip package structure. The method includes following steps. First, a first wafer is provided. The first wafer has a plurality of first chip units, and a plurality of first bumps are disposed on each of the first chip units. The first wafer is then cut, such that each of the first chip units forms a first chip. Next, a second wafer having a plurality of second chip units is provided. Thereafter, the first chips are respectively bonded to the second chip units of the second wafer, such that each of the first chips is electrically connected to the corresponding second chip unit through the first bumps. After that, a first underfill is used to fill between each of the first chips and the corresponding second chip unit, such that the first underfill encapsulates the first bumps. Back surfaces of the first chips are then polished to thin down the first chips. Next, a plurality of second bumps are formed on a surface of each of the second chip units. Here, the surface of each of the second chip units accommodates the first chip. Afterwards, the second wafer is cut, such that each of the second chip units forms a second chip, respectively. Here, each of the second chips, the first chip, the first bumps, and the first underfill constitute a package structure. The package structure is then disposed above a corresponding substrate in a reverse manner and is jointed to the corresponding substrate, such that the second chip of the package structure is electrically connected to the corresponding substrate through the second bumps. Finally, a second underfill is used to fill between the second chip and the corresponding substrate, so as to encapsulate the second bumps, the first chip, and the first underfill.

In an embodiment of the present invention, the first bumps are gold bumps or gold stud bumps.

In an embodiment of the present invention, a method of respectively bonding the first chips to the second chip units of the second wafer includes performing a thermo-compression process or a sonic bonding process.

In an embodiment of the present invention, the second bumps are gold bumps or gold stud bumps.

In an embodiment of the present invention, a height of the second bumps is greater than a distance from a top surface of the first chip to the second chip.

In an embodiment of the present invention, a method of jointing the package structure to the corresponding substrate includes performing a thermo-compression process or a sonic bonding process.

In an embodiment of the present invention, the method of fabricating the stacked type chip package structure further includes polishing a back surface of the second chip, so as to thin down the second chip.

In the method of fabricating the stacked type chip package structure according to the present invention, the thickness of the chips is reduced by stacking the chips, polishing the back surfaces of the chips, and bonding the chips to the substrate (or the chips) through the bumps. Thereby, the entire thickness of the stacked type chip package structure can also be reduced, so as to form a high-density three-dimensional stacked type chip package. Moreover, before the chips are thinned down, the chips can be protected by means of the underfill, so as to ensure the thinning-down of the chips.

To make the above and other objectives, features, and advantages of the present invention more comprehensible, several embodiments accompanied with figures are detailed as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 3A:
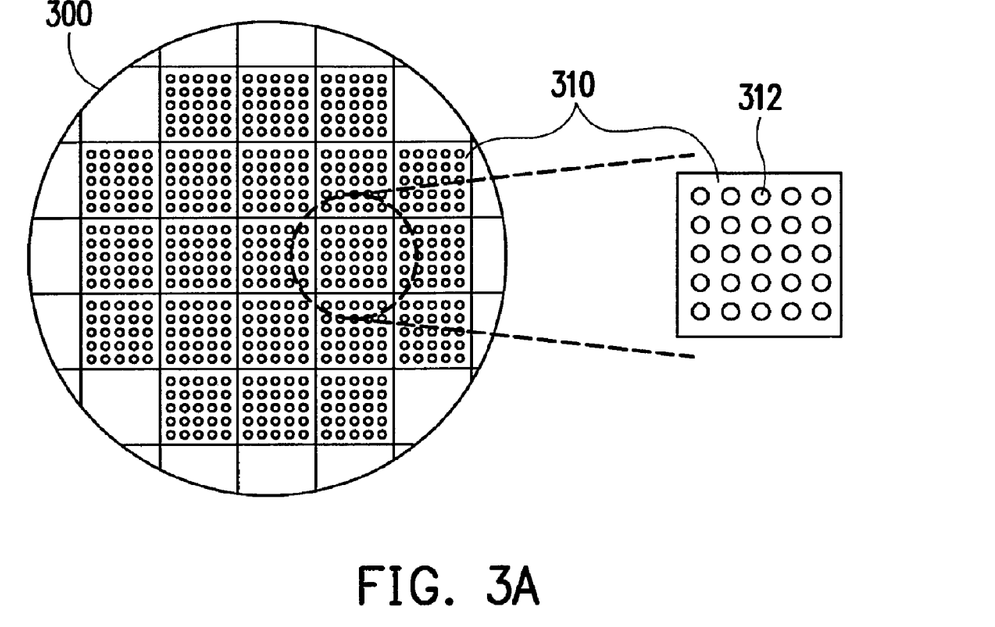
FIGS. 3A through 3M are schematic flowcharts showing a method of fabricating a stacked type chip package structure according to an embodiment of the present invention.
Figure 3B:
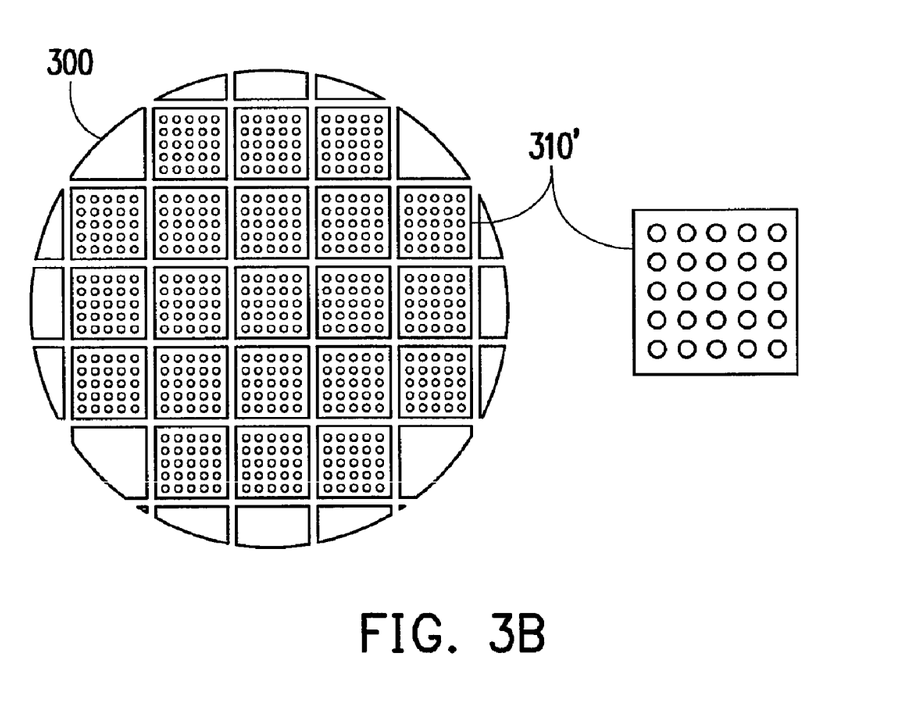
Figure 3C:
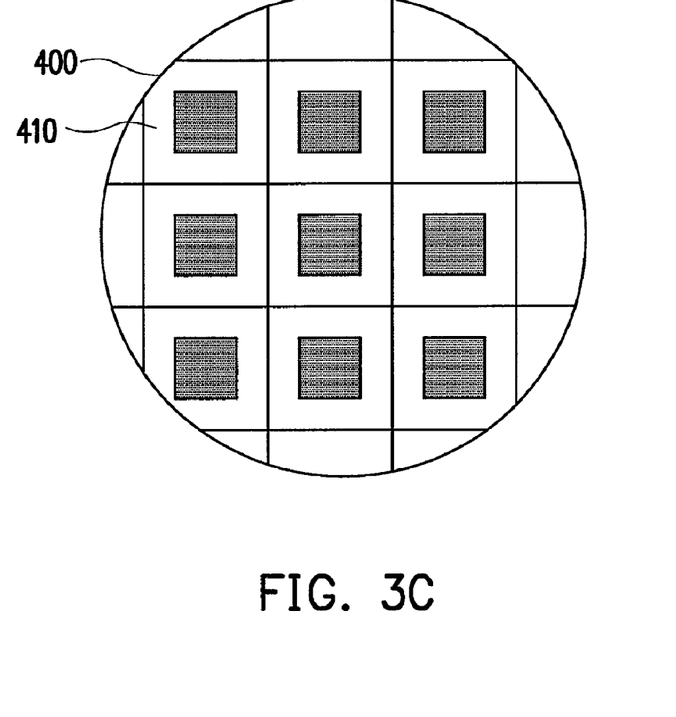
Figure 3D:
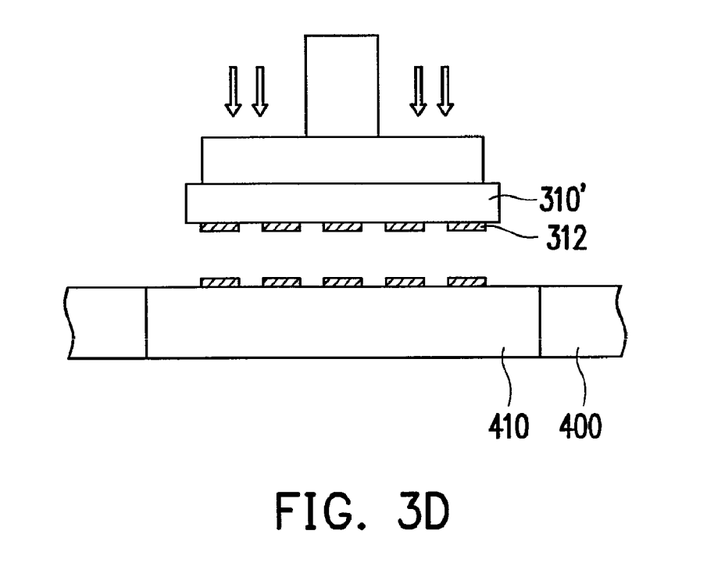

FIGS. 3A through 3M are schematic flowcharts showing a method of fabricating a stacked type chip package structure according to an embodiment of the present invention. First, referring to FIG. 3A, a first wafer 300 is provided. Here, the first wafer 300 has a plurality of first chip units 310, and a plurality of first bumps 312 are disposed on each of the first chip units 310. These first bumps 312 can be gold bumps fabricated by performing exposure, development, and etching processes or gold stud bumps fabricated by wire bonding. However, the present invention poses no limitation on materials of the first bumps 312 and methods of fabricating the same. Next, as shown in FIG. 3B, the first wafer 300 is cut, such that each of the first chip units 310 indicated in FIG. 3A respectively forms a first chip 310'. Thereafter, as shown in FIGS. 3C and 3D, a second wafer 400 having a plurality of second chip units 410 is provided. Besides, the first chips 310' are respectively bonded to the second chip units 410 of the second wafer 400, such that each of the first chips 310' is electrically connected to the corresponding second chip unit 410 through the first bumps 312. In an embodiment of the present invention, the first chips 310' can be respectively bonded to the second chip units 410 of the second wafer 400 by performing a thermo-compression process or a sonic bonding process.

Figure 3E:
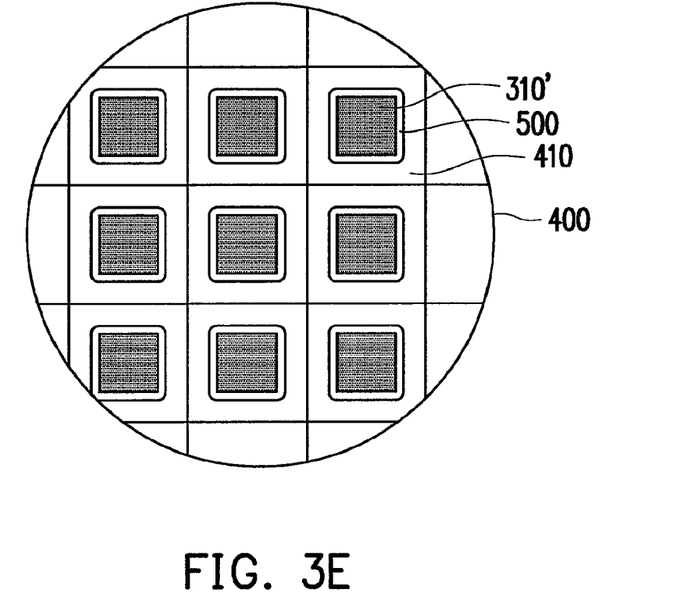
Figure 3F:
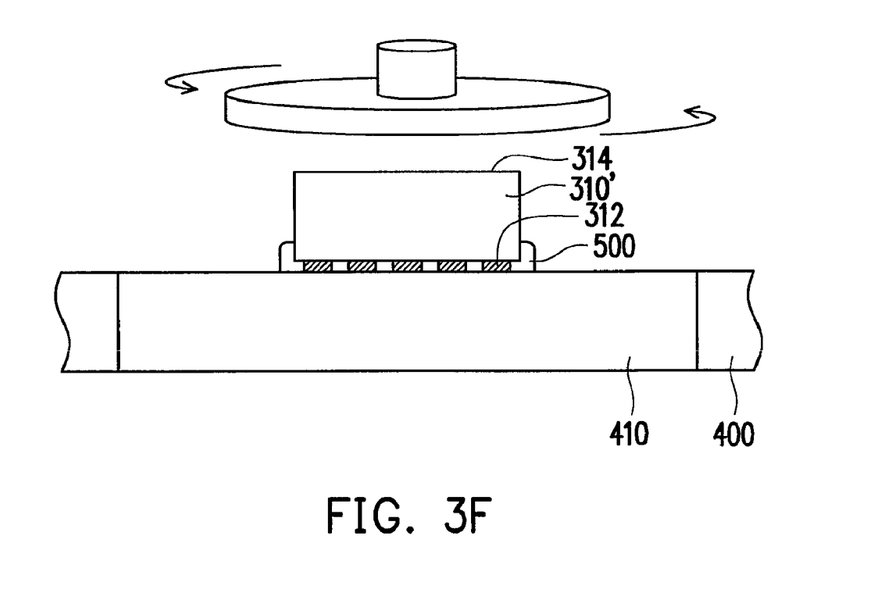
Figure 3G:
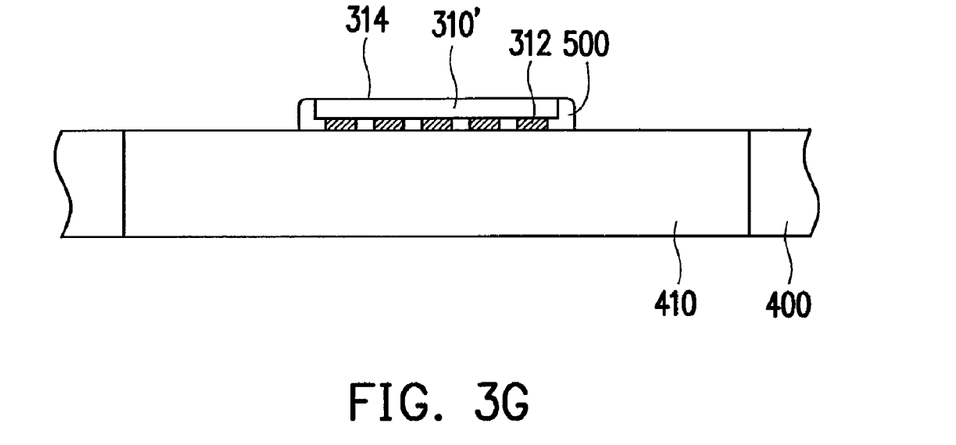

To enhance a bonding strength between the first chips 310' and the second chip units 410, a first underfill 500 is used to fill between each of the first chips 310' and the corresponding second chip unit 410 as indicated in FIG. 3E. Thereby, the first underfill 500 encapsulates the first bumps 312 and prevents the first bumps 310 from damages and moisture. After that, the chips are thinned down. With reference to FIG. 3F, back surfaces 314 of the first chips 310' are polished for thinning down the first chips 310' to a required degree shown in FIG. 3G.

Figure 3H:
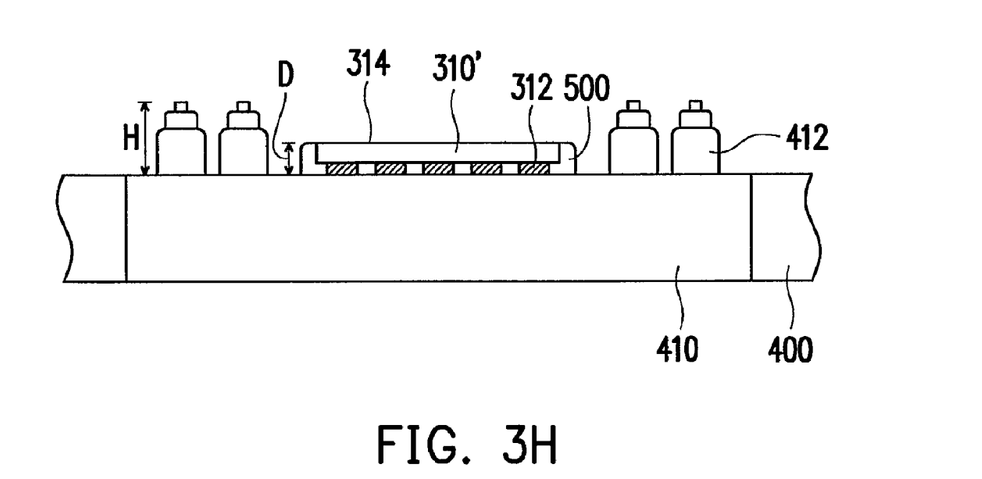

Referring to FIG. 3H, a plurality of second bumps 412 are then formed on a surface of each of the second chip units 410, wherein said surface of each of the second chip units 410 accommodates the first chip 310'. As such, signals can be output from the second chip units 410. Likewise, these second bumps 412 can be the gold bumps fabricated by performing the exposure, development, and etching processes or the gold stud bumps fabricated by wire bonding. In FIG. 3H, when the second bumps 412 are formed by wire bonding, a bump unit can be formed on the surface of the second chip unit 410 at first, and another bump unit is stacked onto the bump unit, such that the second bumps 412 with a relatively significant height are formed.

However, the present invention poses no limitation on materials of the second bumps 412 and methods of fabricating the same. Note that a height H of the second bumps 412 is greater than a distance D from the back surface 314 of the first chip 310' to the surface of the second chip unit 410, such that the second chip unit 410 can be electrically connected to other devices through the second bumps 412.

Figure 3I:
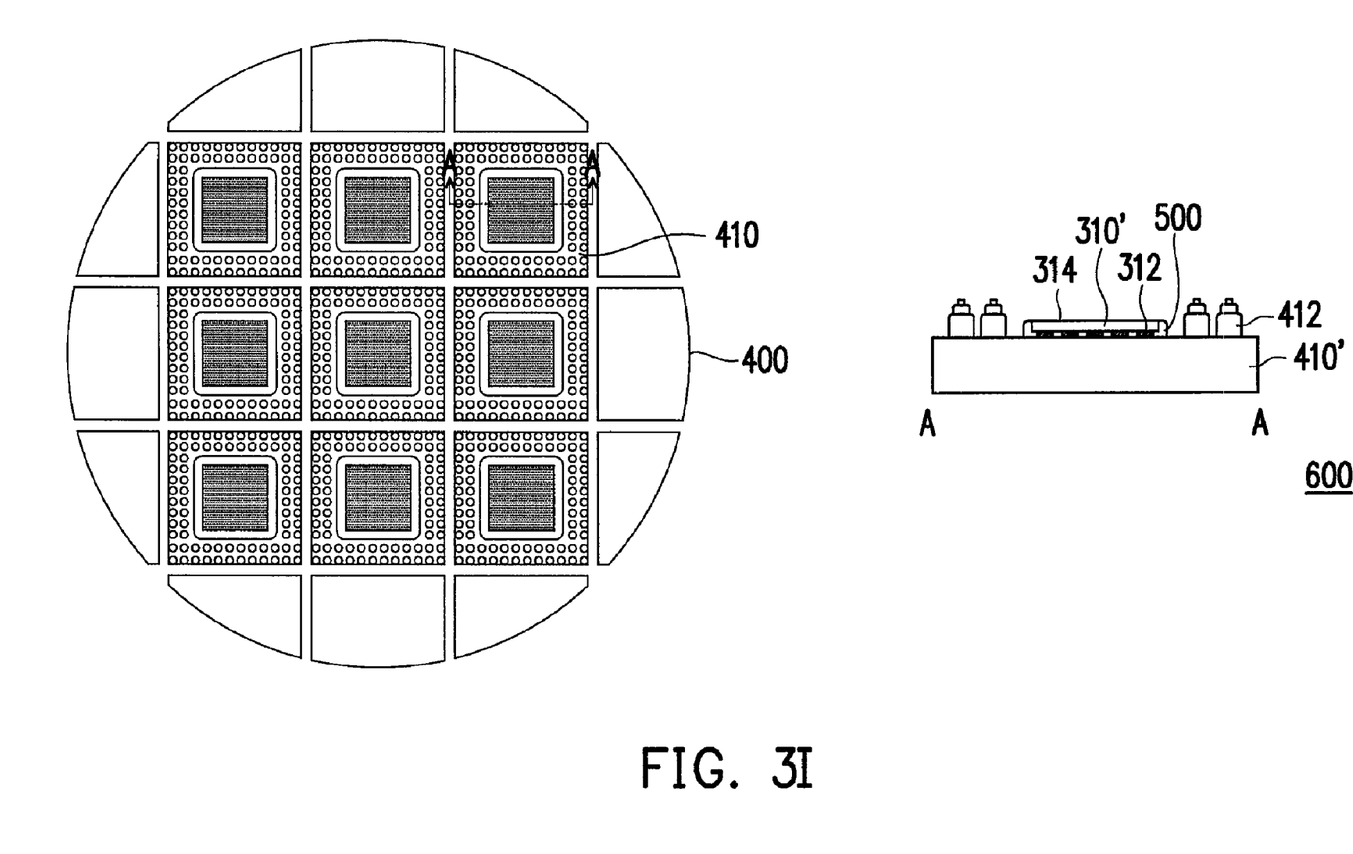
Figure 3J:
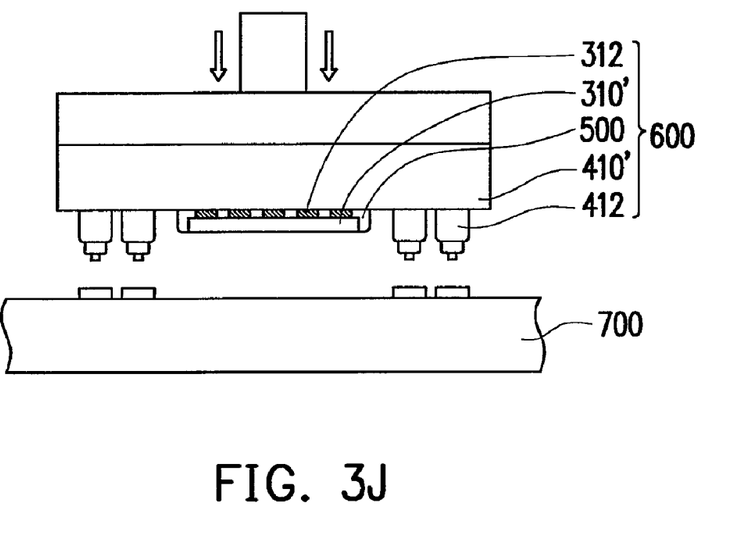
Figure 3K:
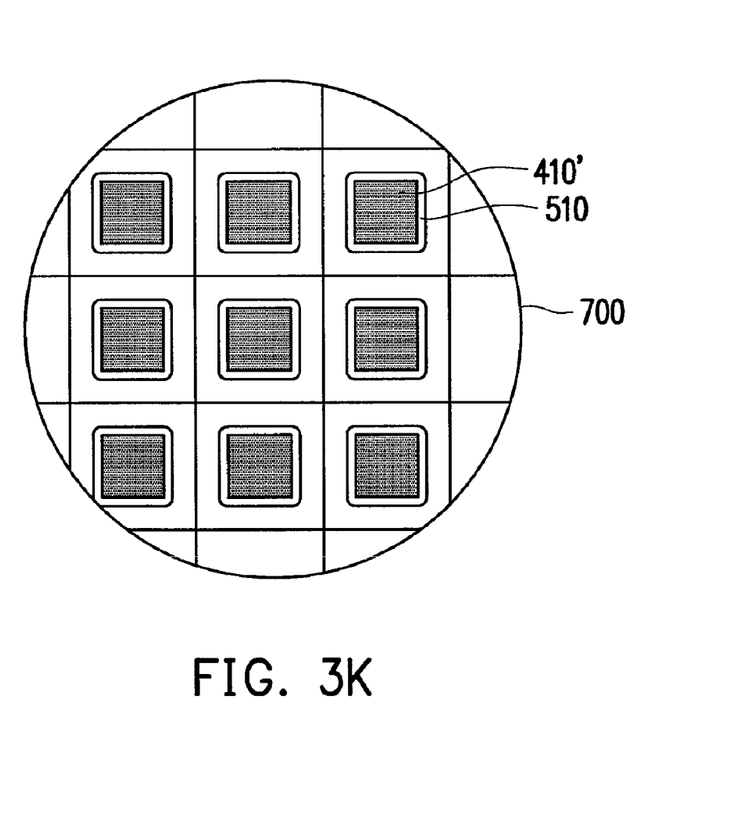

As shown in FIG. 3I, a cross-sectional view of the package structure at the right is taken along a sectional line A-A of the second wafer 400 at the left. Referring to FIG. 3I, the second wafer 400 is cut, such that each of the second chip units 410 forms a second chip 410', respectively. Here, the second chip 410' and the first chip 310' stacked thereon, the first bumps 312 interposed between the first chip 310' and the second chip 410', and the first underfill 500 together constitute a package structure 600. As shown in FIG. 3J, the package structure 600 is then disposed above a corresponding substrate 700 in a reverse manner and is bonded to the corresponding substrate 700, such that the second chip 410' of the package structure 600 is electrically connected to the corresponding substrate 700 through the second bumps 412. The corresponding substrate 700 can be a wafer, a printed circuit board, or any other appropriate substrates. Similarly, the second chips 410' can be respectively bonded to the corresponding substrate 700 by performing the thermo-compression process or the sonic bonding process. Finally, with reference to FIG. 3K, a second underfill 510 is used to fill between each of the second chips 410' and the corresponding substrate 700 for encapsulating the second bumps 412, the first chip 310', and the first underfill 500, so as to prevent the second bumps 412, the first chip 310', and the first underfill 500 from damages and moisture. Up to here, the process of fabricating a stacked type chip package structure 800 of the present invention is basically completed. The stacked type chip package structure 800 mainly includes two chips stacked together.

Figure 3L:
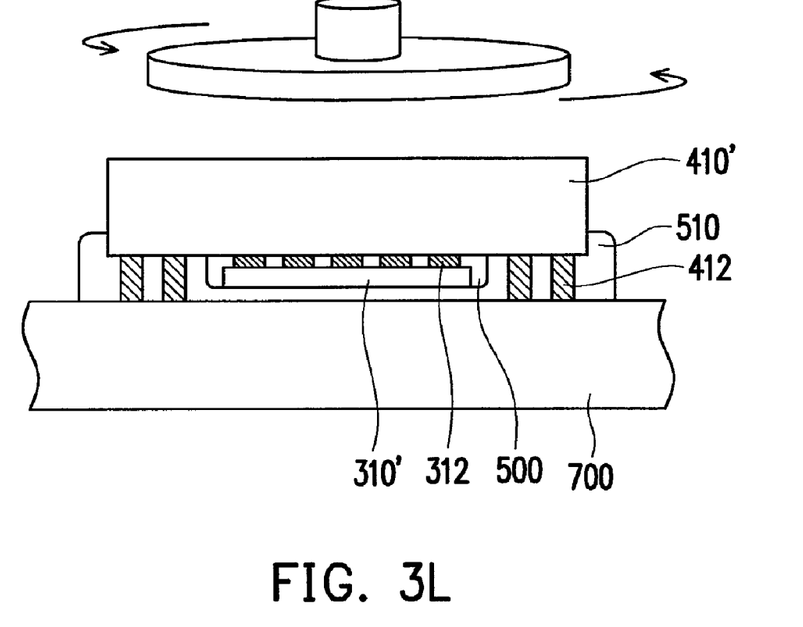

In addition, to further reduce the thickness of the stacked type chip package structure, it is alternative to thin down the second chips 410'. With reference to FIG. 3L, back surfaces of the second chips 410' are polished to a required degree as shown in FIG. 3M.

Figure 4:
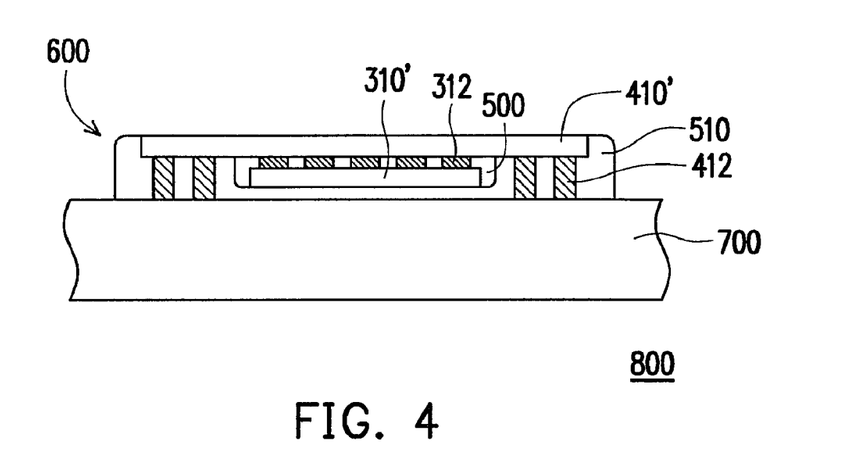
FIG. 4 is a schematic cross-sectional view of a stacked type chip package structure fabricated by performing the steps illustrated in FIGS. 3A through 3M.

FIG. 4 is a schematic cross-sectional view of a stacked type chip package structure fabricated by performing the aforesaid steps. Referring to FIG. 4, the stacked type chip package structure 800 mainly includes the package structure 600, the corresponding substrate 700, and the plurality of second bumps 412 connected between the package structure 600 and the corresponding substrate 700. As indicated in FIG. 4, the package structure 600 includes the first chip 310', the second chip 410', the plurality of first bumps 312, and the first underfill 500. The first chip 310' is disposed above the second chip 410', and the first bumps 312 are interposed between the first chip 310' and the second chip 410', such that the first chip 310' is electrically connected to the second chip 410' through the first bumps 312. The first underfill 500 fills between the first chip 310' and the second chip 410' and encapsulates the first bumps 312, so as to prevent the first bumps 312 from damages and moisture. The package structure 600 is disposed above the corresponding substrate 700 in a reverse manner, such that the first chip 310' is disposed between the second chip 410' and the corresponding substrate 700. The second bumps 412 are disposed between the second chip 410' and the corresponding substrate 700, such that the second chip 410' is electrically connected to the corresponding substrate 700 through the second bumps 412.

Besides, the stacked type chip package structure 800 can further include the second underfill 510 filling between the second chip 410' and the corresponding substrate 700 and encapsulating the second bumps 412, the first chip 310, and the first underfill 500. Thereby, the package substrate 600 and the second bumps 412 can be prevented from damages and moisture.

Figure 3M:
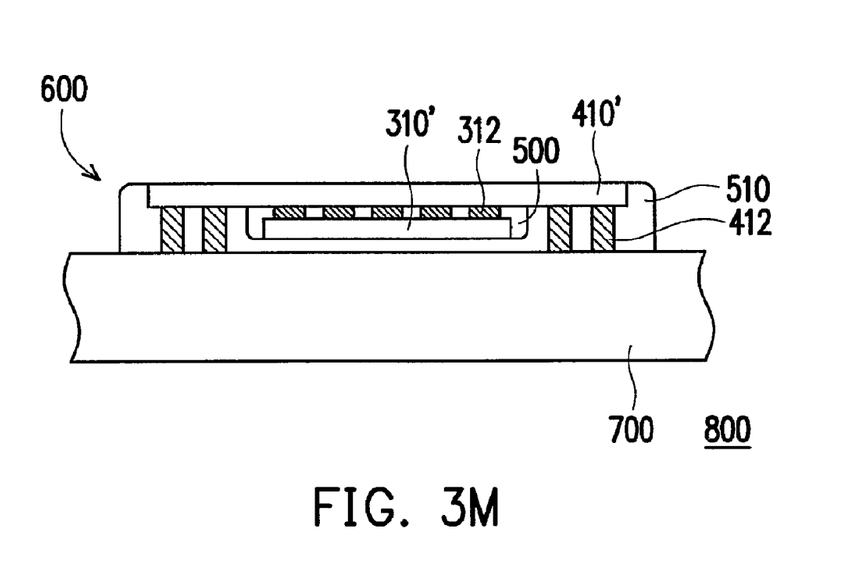
Figure 5:
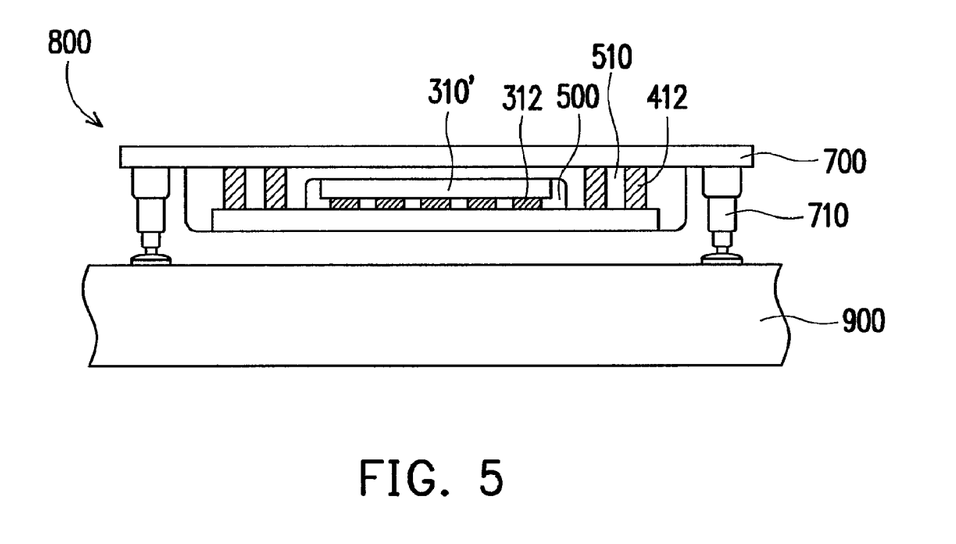
FIGS. 5 and 6 are schematic cross-sectional views showing a stacked type chip package structure formed by stacking three chips together.
Figure 6:
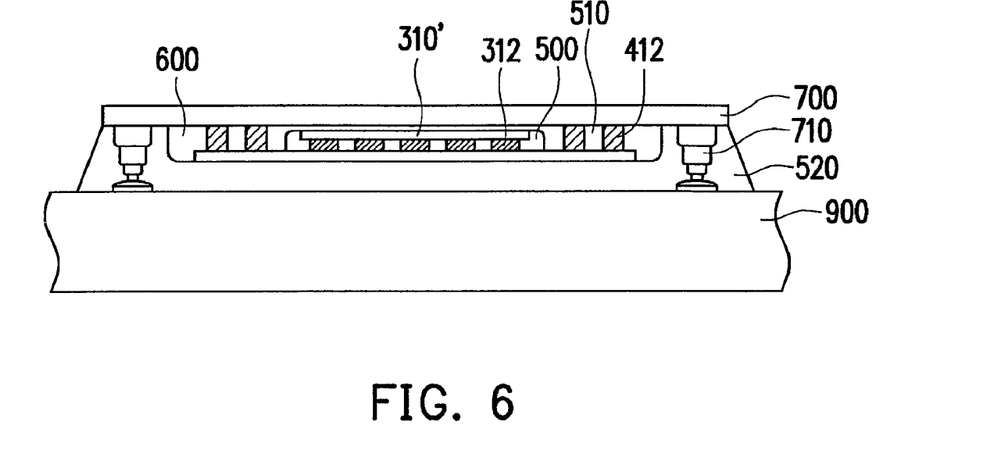

Moreover, given that more chips are intended to be stacked together, the corresponding substrate 700 of FIG. 3M can be thinned down as shown in FIG. 5. That is to say, a back surface of the corresponding substrate 700 is polished to reduce the thickness of the corresponding substrate 700. After that, a plurality of third bumps 710 are formed on the corresponding substrate 700, such that the corresponding substrate 700 is electrically connected to another substrate 900. Likewise, as indicated in FIG. 6, a third underfill 520 can be used to fill between the corresponding substrate 700 and the substrate 900, so as to protect the package structure 600 and the third bumps 710 from damages and moisture. In the embodiments depicted in FIGS. 5 and 6, three chips are stacked together for exemplifying the present invention, whereas the steps illustrated in FIGS. 3A through 3M can be repetitively implemented based on different demands, so as to form the stacked type chip package structure in which the required chips are stacked together. The present invention poses no limitation on the number of the chips in the stacked type chip package structure 800.

To sum up, in the method of fabricating the stacked type chip package structure according to the present invention, the thickness of the entire stacked type chip package structure is reduced by stacking the chips, thinning down the chips (e.g. polishing the back surfaces of the chips), and bonding the chips to the substrate (or the chips) through the bumps. Thereby, the high-density three-dimensional stacked type chip package can be formed. Moreover, before the chips are thinned down, the chips can be protected by means of the underfill, so as to ensure the thinning-down of the chips.

Although the present invention has been disclosed by the above embodiments, they are not intended to limit the present invention. Anybody skilled in the art may make some modifications and alterations without departing from the spirit and scope of the present invention. Therefore, the protection range of the present invention falls in the appended claims.

What is claimed is:

1. A method of fabricating a stacked type chip package structure, the method comprising:
    providing a first wafer, wherein the first wafer has a plurality of first chip units, and a plurality of first bumps are disposed on each of the first chip units;
    cutting the first wafer, such that each of the first chip units forms a first chip, respectively;
    providing a second wafer that has a plurality of second chip units;
    respectively bonding the first chips to the second chip units of the second wafer, such that each of the first chips is electrically connected to the corresponding second chip unit through the first bumps;
    filling between each of the first chips and the corresponding second chip unit with a first underfill, such that the first underfill encapsulates the first bumps;
    polishing back surfaces of the first chips to remove a portion of each of the first chips;
    forming a plurality of second bumps on a surface of each of the second chip units after polishing the back surfaces of the first chips, wherein said surface of each of the second chip units accommodates the first chip;
    cutting the second wafer, such that each of the second chip units respectively forms a second chip, wherein each of the second chips, the first chip, the first bumps, and the first underfill constitute a package structure;
    disposing the package structure above a corresponding substrate in a reverse manner and bonding the package structure to the corresponding substrate, such that the second chip of the package structure is electrically connected to the corresponding substrate through the second bumps; and
    filling between the second chip and the corresponding substrate with a second underfill, so as to encapsulate the second bumps, the first chip, and the first underfill.

2. The method of fabricating the stacked type chip package structure as claimed in claim 1, wherein the first bumps are gold bumps or gold stud bumps.

3. The method of fabricating the stacked type chip package structure as claimed in claim 1, wherein a method of respectively bonding the first chips to the second chip units of the second wafer comprises performing a thermo-compression process or a sonic bonding process.

4. The method of fabricating the stacked type chip package structure as claimed in claim 1, wherein the second bumps are gold bumps or gold stud bumps.

5. The method of fabricating the stacked type chip package structure as claimed in claim 1, wherein a height of the second bumps is greater than a distance from the back surface of the first chip to the second chip.

6. The method of fabricating the stacked type chip package structure as claimed in claim 1, wherein a method of bonding the package structure to the corresponding substrate comprises performing a thermo-compression process or a sonic bonding process.

7. The method of fabricating the stacked type chip package structure as claimed in claim 1, further comprising a process of polishing a back surface of the second chip, so as to thin down the second chip.

8. The method of fabricating the stacked type chip package structure as claimed in claim 1, wherein the corresponding substrate is a wafer.

9. The method of fabricating the stacked type chip package structure as claimed in claim 8, further comprising a process of polishing a back surface of the corresponding substrate, so as to thin down the corresponding substrate.

10. The method of fabricating the stacked type chip package structure as claimed in claim 1, wherein the corresponding substrate is printed circuit board.

11. The method of fabricating the stacked type chip package structure as claimed in claim 1, further comprising a process of forming a plurality of third bumps on the corresponding substrate.

12. The method of fabricating the stacked type chip package structure as claimed in claim 9, further comprising a process of forming a plurality of third bumps on the corresponding substrate.

13. A method of fabricating a stacked type chip package structure, the method comprising:
   providing a first chip and a second chip;
   bonding the first chip to the second chip, such that the first chip is electrically connected to the second chip through a plurality of first bumps;
   filling between the first chip and the second chip with a first underfill, such that the first underfill encapsulates the first bumps;
   polishing back surface of the first chip to remove a portion of the first chip, so as to thin down the first chip;
   forming a plurality of second bumps on a surface of the second chip after polishing the back surface of the first chip, wherein said surface of the second chip accommodates the first chip, wherein the second chip, the first chip, the first bumps, and the first underfill constitute a package structure;
   disposing the package structure above a corresponding substrate in a reverse manner and bonding the package structure to the corresponding substrate, such that the second chip of the package structure is electrically connected to the corresponding substrate through the second bumps; and
   filling between the second chip and the corresponding substrate with a second underfill, so as to encapsulate the second bumps, the first chip, and the first underfill.

14. The method of fabricating the stacked type chip package structure as claimed in claim 13, wherein a height of the second bumps is greater than a distance from the back surface of the first chip to the second chip.

* * * * *